US010422877B2

(12) United States Patent
Halliday (10) Patent No.: US 10,422,877 B2
(45) Date of Patent: Sep. 24, 2019

(54) SUBSTRATE EMBEDDED TIME OF FLIGHT SENSOR PACKAGING (71) Applicant: STMicroelectronics (Research & Development) Limited, Marlow, Buckinghamshire (GB)

(72) Inventor: William Halliday, Edinburgh (GB)

(73) Assignee: STMicroelectronics (Research & Development) Limited, Marlow (GB)

(*) Notice: Subject to any disclaimer, the term of this patent is extended or adjusted under 35 U.S.C. 154(b) by 427 days.

(21) Appl. No.: 15/172,548

(22) Filed: Jun. 3, 2016

(65) Prior Publication Data
US 2017/0350981 A1    Dec. 7, 2017

(51) Int. Cl.
*G01S 17/08* (2006.01)
*H01L 31/167* (2006.01)
*H01L 31/02* (2006.01)
*H01L 31/0232* (2014.01)
*G01S 7/481* (2006.01)

(52) U.S. Cl.
CPC ........... *G01S 17/08* (2013.01); *G01S 7/4813* (2013.01); *G01S 7/4814* (2013.01); *G01S 7/4816* (2013.01); *H01L 31/02005* (2013.01); *H01L 31/02327* (2013.01); *H01L 31/167* (2013.01)

(58) Field of Classification Search
CPC ..... G01S 7/4813; H01S 5/18341; H01S 5/183
See application file for complete search history.

(56) References Cited

U.S. PATENT DOCUMENTS

| 5,266,794 | A   | * | 11/1993 | Olbright ................. G02B 6/43 250/214 LS |
| 5,905,750 | A   | * | 5/1999  | Lebby ................. H01S 5/02296 369/121 |
| 9,768,341 | B2  | * | 9/2017  | Luan ..................... H01L 31/173 |
| 2002/0105699 | A1 | * | 8/2002  | Miracky ............. G02B 6/1245 398/56 |
| 2005/0186786 | A1 | * | 8/2005  | Brintzinger ....... H01L 21/76843 438/650 |
| 2014/0231635 | A1 | * | 8/2014  | Kerness ............... G01S 17/026 250/226 |
| 2014/0269804 | A1 | * | 9/2014  | Lai ........................ H01S 5/0262 372/50.21 |
| 2014/0319548 | A1 | * | 10/2014 | Luan ..................... H01L 31/173 257/82 |
| 2017/0090018 | A1 | * | 3/2017  | Buettgen ................ G01S 17/89 |

* cited by examiner

Primary Examiner — Eric L Bolda
(74) Attorney, Agent, or Firm — Crowe & Dunlevy (57) ABSTRACT Disclosed herein is an electronic device having a substrate, and an integrated circuit disposed within the substrate and having a top surface. The integrated circuit may be a laser emitting integrated circuit or a reflected light detector. A first interconnect layer is formed on the top surface of the substrate. A first optically transparent layer is formed on the top surface of the substrate and covering the top surface of the integrated circuit. A second interconnect layer is formed on a top surface of the first optically transparent layer. The second interconnect layer is patterned so as to not obstruct light traveling to or from the top surface of the integrated circuit through the first optically transparent layer.

24 Claims, 8 Drawing Sheets

SUBSTRATE EMBEDDED TIME OF FLIGHT SENSOR PACKAGING

TECHNICAL FIELD

This disclosure relates to the field of time of flight ranging systems, and, more particularly, to electronic device packages containing time of flight ranging systems and associated methods of making those electronic device packages.

BACKGROUND

Time of flight ranging systems are now used in a variety of commercial and consumer products. A typical time of flight ranging system includes a ranging light emitter, such as a laser, that emits pulses of light. This light travels toward a target, and some of the light reflects off the target surface and returns to the time of flight ranging system where it is detected by a reflected light detector. Since the speed of light is known, by precisely measuring the elapsed time between emission of the light and detection of the reflected light, the distance between the time of flight ranging system and the target can be determined.

Particularly in the realm of consumer products, there is an ever present desire for miniaturization of components. Therefore, new developments in packaging arrangements and methods for building those packaging arrangements are desired for time of flight ranging systems.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

Disclosed herein is an electronic device having a substrate, and an integrated circuit disposed within the substrate and having a top surface. The integrated circuit may be a laser emitting integrated circuit or a reflected light detector. A first interconnect layer is formed on the top surface of the substrate. A first optically transparent layer is formed on the top surface of the substrate and covering the top surface of the integrated circuit. A second interconnect layer is formed on a top surface of the first optically transparent layer. The second interconnect layer is patterned so as to not obstruct light traveling to or from the top surface of the integrated circuit through the first optically transparent layer.

Also disclosed herein is an electronic device having a substrate, with a laser emitting integrated circuit disposed within the substrate and having a top surface. A first interconnect layer is formed on a top surface of the substrate, and a first optically transparent layer formed on the top surface of the substrate and covering the top surface of the laser emitting integrated circuit. A second interconnect layer is formed on a top surface of the first optically transparent layer. The second interconnect layer is patterned so as to permit light emitted from the top surface of the laser emitting integrated circuit to pass through the first optically transparent layer and exit the electronic device.

Another electronic device disclosed herein includes a substrate, with a reflected light detector disposed within the substrate and having a top surface. A first interconnect layer is formed on the top surface of the substrate, and a first optically transparent layer is formed on a top surface of the substrate and covering the top surface of the reflected light detector. A second interconnect layer is formed on a top surface of the first optically transparent layer. The second interconnect layer is patterned so as to permit light to pass through the first optically transparent layer and reach the reflected light detector.

Also disclosed herein is a method of making the electronic device. The method includes forming a first interconnect layer on a substrate, and forming a cavity in the substrate. A bottom side of the substrate is laminated so as to cover a bottom side of the cavity, and an integrated circuit is placed within the cavity of the substrate. A first optically transparent layer is disposed on the top surface of the substrate and covering a top surface of the integrated circuit. A second interconnect layer is disposed on a top surface of the first optically transparent layer in a pattern that does not obstruct light traveling to or from the top surface of the integrated circuit. The integrated circuit is a laser emitting integrated circuit or a reflected light detector.

DETAILED DESCRIPTION

The present description is made with reference to the accompanying drawings, in which example embodiments are shown. However, many different embodiments may be used, and thus the description should not be construed as limited to the embodiments set forth herein. Rather, these embodiments are provided so that this disclosure will be thorough and complete. Like numbers refer to like elements throughout, and elements separated in number by century are similar.

Figure 1:
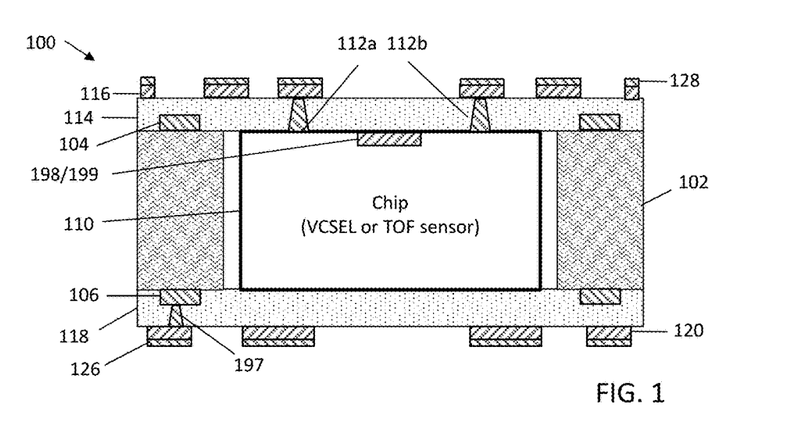
FIG. 1 is a schematic cross sectional diagram of an electronic device in accordance with this disclosure where either a VCSEL or time of flight sensor has terminals on a top side thereof and is packaged within a substrate.

With initial reference to FIG. 1, an electronic device 100 is now described. The electronic device 100 includes a chip 110, such as one incorporating a vertical cavity surface emitting laser (VCSEL) diode or a time of flight sensor (such as a single photon avalanche diode), embedded within a substrate 102. In the case where the chip 110 includes a VCSEL diode, it emits laser light from its top surface, and in the case where the chip 110 includes a time of flight sensor, it senses light impinging upon its top surface. The chip 110 has terminals 112a, 112b extending from an upper surface thereof. The size of the chip may range from 0.8 mm×0.8 mm to 0.15 mm×0.15 mm, with a thickness ranging between 0.1 mm to 0.3 mm.

The substrate 102 may be comprised of any suitable substrate material, such as one meeting the known FR4 standards, and may have a size ranging from 5.0 mm×4.0 mm to 2.0 mm to 3.0 mm, with a thickness ranging between 400 µm to 300 µm.

Interconnect layer 104 is formed on the top surface of the substrate 102, while interconnect layer 106 is formed on the bottom surface of the substrate 102. The interconnect layers 104 and 106 may be constructed from copper or other suitable materials, with thicknesses on the order of 35 µm.

An optically transparent layer 114 is formed on the top surface of the substrate 102, covering the top surface of the chip 110 as well as the interconnect layer 104. The top surface of the optically transparent layer 114 is shown as even with the top surface of the terminals 112a, 112b of the chip 110, although in some instances may be uneven such that access to the terminals 112a and 112b is easily provided. Similarly, an optically transparent layer 118 is formed on the bottom surface of the substrate 102, covering the bottom surface of the chip 110 as well as the interconnect layer 106.

The optically transparent layers 114, 118 are to be transparent or permissive to the passing of light of the same optical wavelength of that emitted by, or detected by, the chip 110. One suitable material from which the optically transparent layers 114, 118 may be constructed from build-up film, such as ABF, although any suitable material may be used. The optically transparent layers 114, 118 may have a thickness on the order of 25 µm.

An interconnect layer 116 is formed on the top surface of the optically transparent layer 114, and an interconnect layer 120 is formed on the bottom surface of the optically transparent layer 118. The interconnect layers 116, 120 may be constructed from copper or other suitable materials, with thicknesses on the order of 40 µm.

Vias 197 may extend through the optically transparent layers 114 and 118 so as to respectively connect the interconnect layers 104 and 116, and 106 and 110.

Metallic coating layers 128 and 126 are respectively formed on the outer surfaces of the interconnect layers 116 and 120. The metallic coating layers 128, 126 may be constructed from NiAu and function to protect the exposed surfaces of the interconnect layer 116 and 128.

The use of the optically transparent layer 114, together with the patterning of the interconnect layers 104 and 116, permit the entry and exit of light into the chip 110, making the electronic device 100 usable and useful for performing time of flight ranging.

Other advantages of this design include a higher thermal stability due to the embedding of the chip 110, as well as electromagnetic shielding provided by the interconnect layers 104, 116 and 106, 120. In some applications, additional layers including different shielding structures may be included. Also, the use of interconnect layers instead of wire bonds may help to reduce generated or detected electromagnetic interference, to reduce impedances, and to permit direct connection to driver circuitry.

Figure 2:
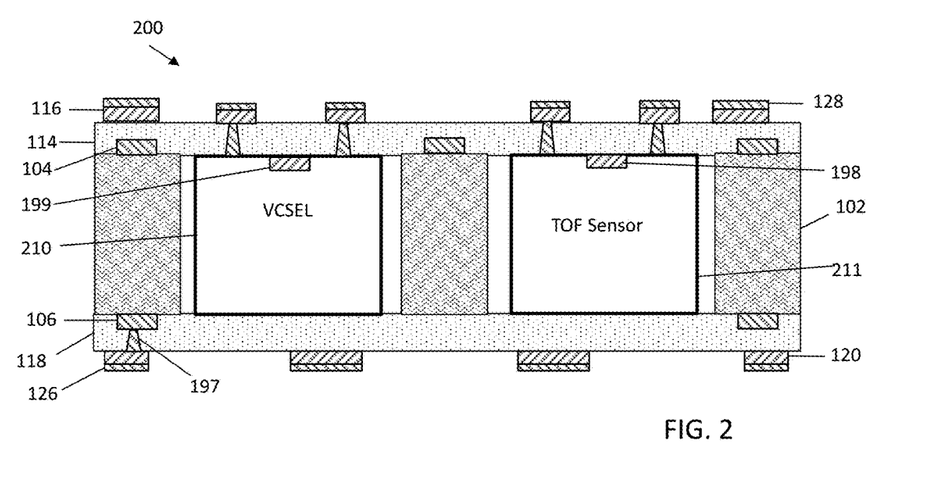
FIG. 2 is a schematic cross sectional diagram of an electronic device in accordance with this disclosure where both a VCSEL and a time of flight sensor is packaged within a substrate.

A variety of similar permutations of the design described above are within the scope of this disclosure. For example, as shown in FIG. 2, both a VCSEL 210 and time of flight sensor 211 may be embedded within the substrate 102. This permits the creation of a single package for use in a time of flight system. Moreover, it allows for producing of a device having connections to both the VCSEL 210 and time of flight sensor 211 that are at a same height even if the terminals of those components have different heights.

Figure 3:
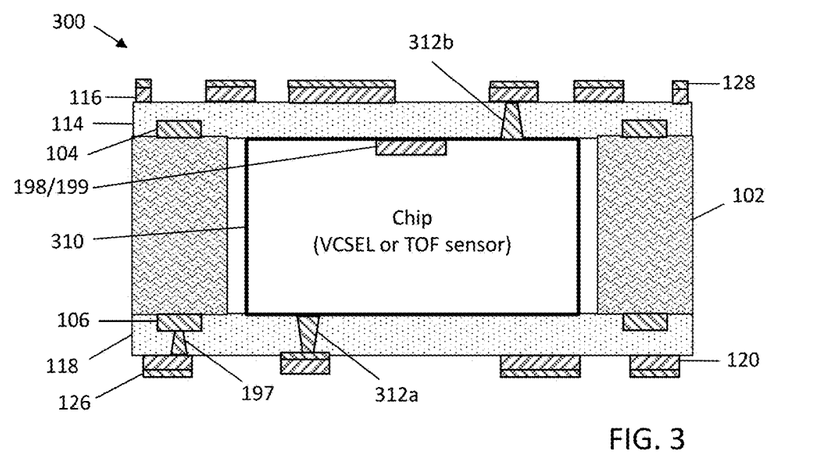
FIG. 3 is a schematic cross sectional diagram of an electronic device in accordance with this disclosure where either a VCSEL or time of flight sensor has terminals on top and bottom sides thereof and is packaged within a substrate.

As shown in FIG. 3, the chip 310 need not have both of its terminals extending from its top surface, and may instead have one terminal 312b extending from its top surface, while its other terminal 312a extends from its bottom surface. In other applications, both terminals might extend from the bottom surface, or there may be any number of terminals, with each extending from either the top or bottom surface.

Figure 4:
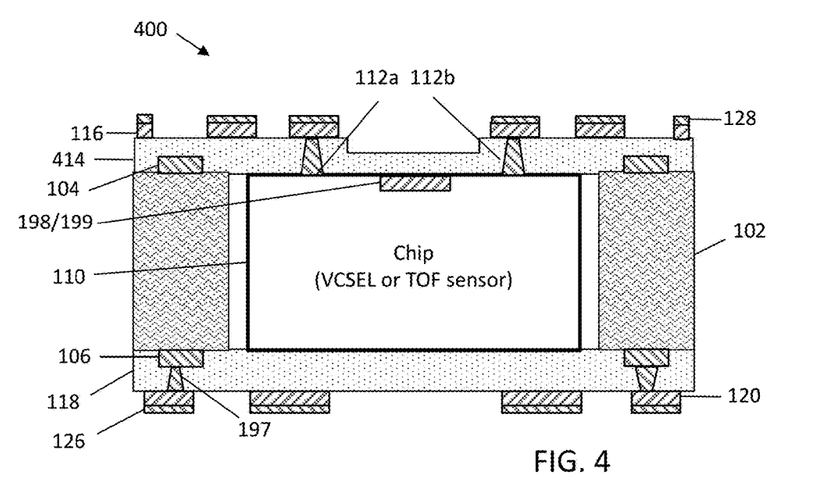
FIG. 4 is a schematic cross sectional diagram of an electronic device in accordance with this disclosure with either a VCSEL or time of flight sensor similar to that of FIG. 1 but where the first optically transparent layer has been thinned adjacent a top surface of the VCSEL or time of flight sensor.
Figure 5:
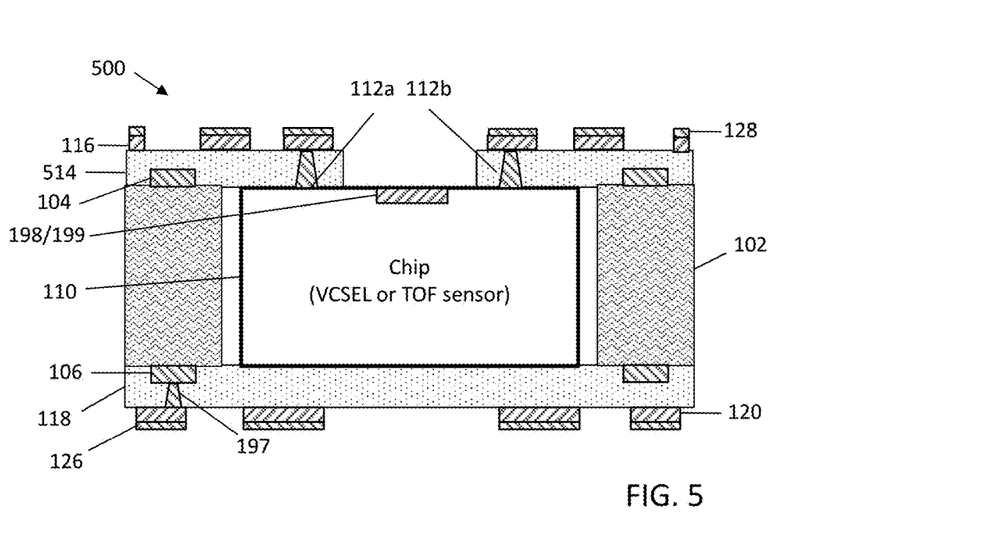
FIG. 5 is a schematic cross sectional diagram of an electronic device in accordance with this disclosure with either a VCSEL or time of flight sensor similar to that of FIG. 1 but where the first optically transparent layer has been removed adjacent a top surface of the VCSEL or time of flight sensor.

In some applications, perhaps due to the specific material used to construct the optically transparent layer 414 or due to the wavelength of the light to enter or exit the chip 110, the optically transparent layer 414 may have a reduced thickness adjacent a portion of the top surface of the chip 110. Such a situation is shown in FIG. 4. In yet another application, the optically transparent layer 514 may be completely removed adjacent a top portion of the top surface of the chip 110, such as shown in FIG. 5.

Figure 6:
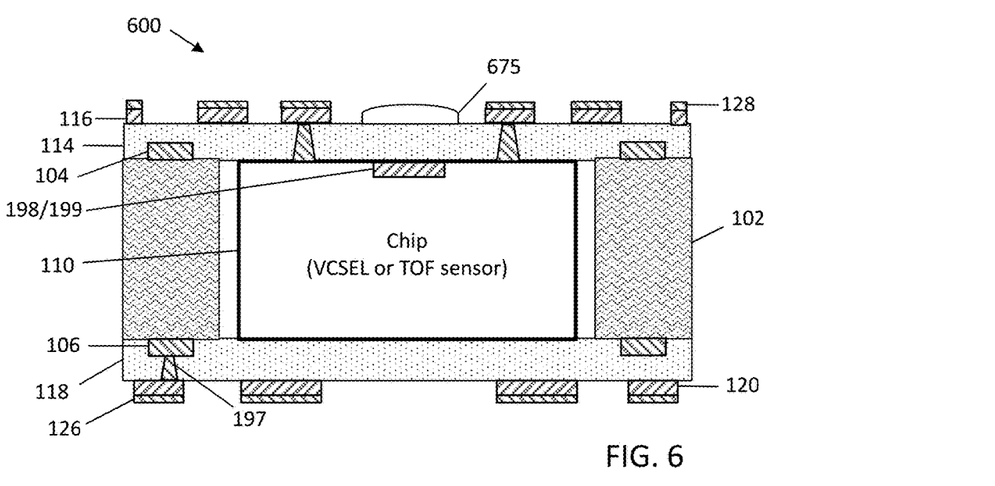
FIG. 6 is a schematic cross sectional diagram of an electronic device in accordance with this disclosure with either a VCSEL or time of flight sensor similar to that of FIG. 1 but where a lens covers a portion of the top surface of the chip.
Figure 18:
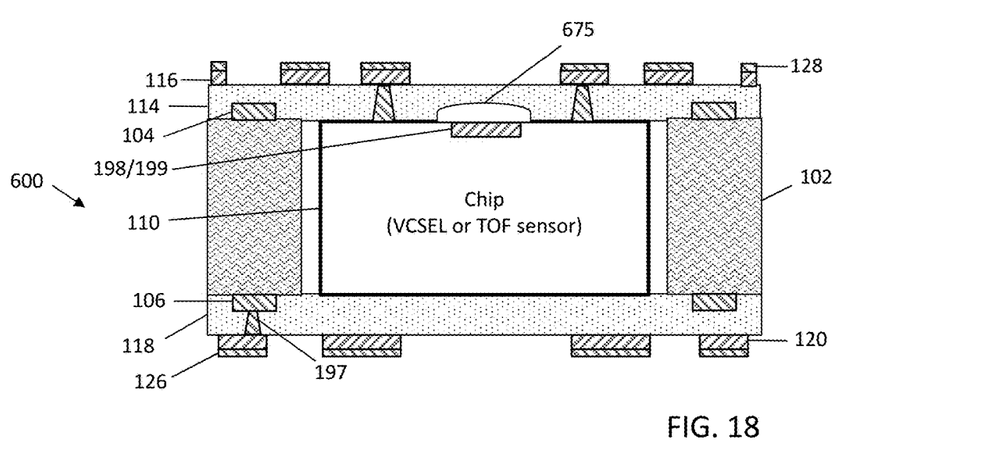
FIG. 18 is a schematic cross sectional diagram of an electronic device in accordance with this disclosure similar to that of FIG. 1 but where a lens covers a portion of the top surface of the chip and is in turn covered by the first optically transparent layer.

The electronic device 100 may be incorporated into a variety of structures and devices, and may have external components attached. For example, as shown in FIG. 6, a lens 675 may be attached to the top surface of the optically transparent layer 114 adjacent the top surface of the chip 110 so as to focus light entering or exiting the chip 110. Similarly, as shown in FIG. 18, a lens or transparent cap 676 may be attached to the top surface of the chip 110 but covered by the optically transparent layer 114.

Figure 7:
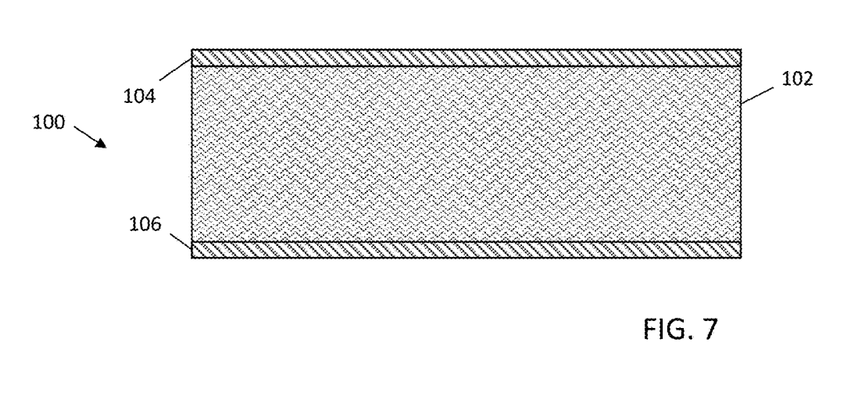
FIGS. 7-17 are a series of schematic cross sectional diagrams showing formation of the electronic device of FIG. 1.
Figure 8:
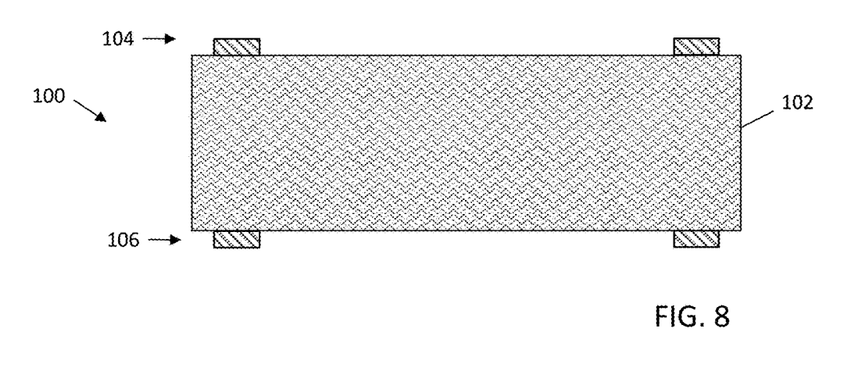

Formation of the electronic device 100 will now be described with reference to the series shown in FIGS. 7-17. Initially, the substrate 102 is clad with copper layers 104a and 106a that will ultimately become interconnect layers (FIG. 7). Then, the copper layers 104a and 106a are patterned into suitable shapes so as to become interconnect layers 104 and 106 (FIG. 8). This patterning is performed via suitable processes, such as etching. In some applications, the copper layers 104a and 106a may instead be part of a film layer that is applied to the substrate 102.

Figure 9:
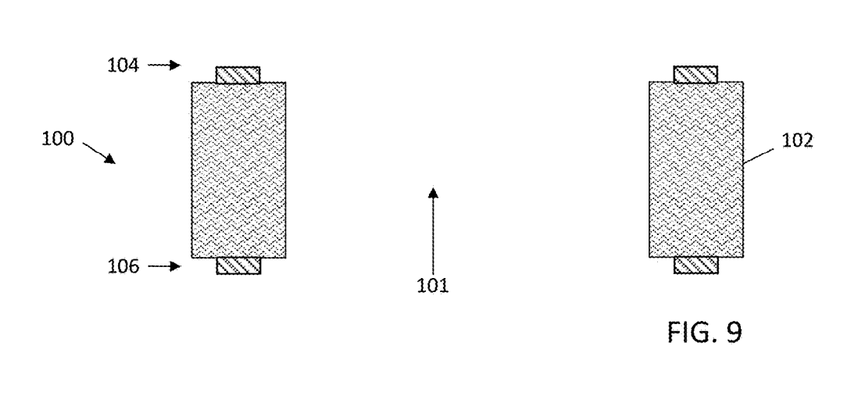
Figure 10:
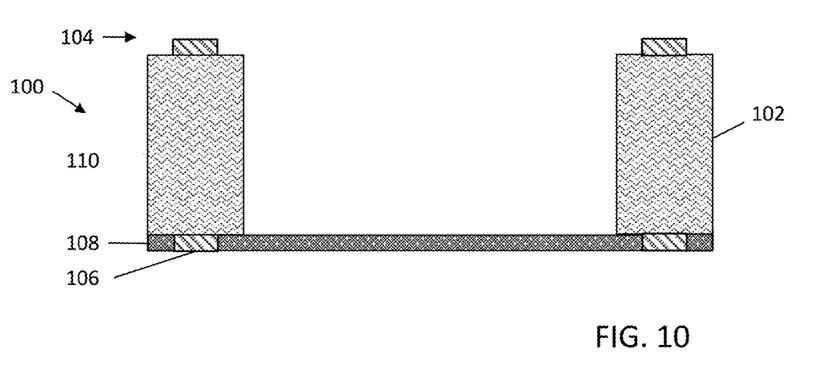
Figure 11:
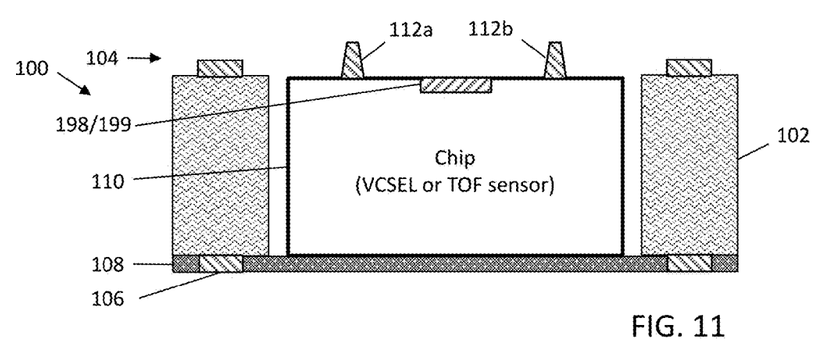

Next, a cavity 101 is formed into the substrate 102 via suitable processes (FIG. 9). Thereafter, an adhesive layer 108 is laminated to the bottom surface of the substrate 102 so as to close off the bottom side of the cavity 101 formed in the substrate 102 (FIG. 10). Then, the chip 110 is placed into the cavity 101 (FIG. 11).

Figure 12:
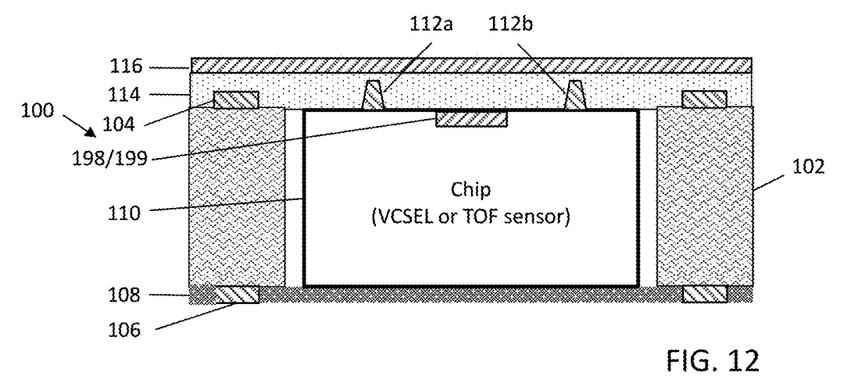

Then, a sheet of optically transparent material 114, with pre-formed copper cladding 116 thereon is laid on top of the chip 110, interconnect layer 104, and substrate 102 and pressed into place (FIG. 12). Laser drilling and copper plating is then used to connect the terminals 112b, 112b to the copper cladding 116 (FIG. 13).

Figure 13:
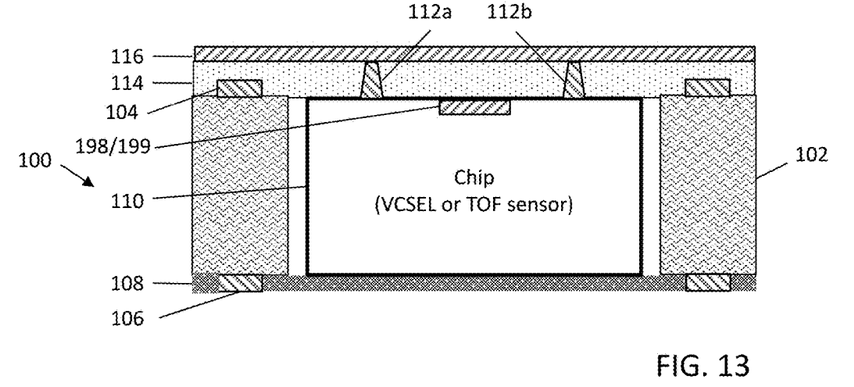
Figure 14:
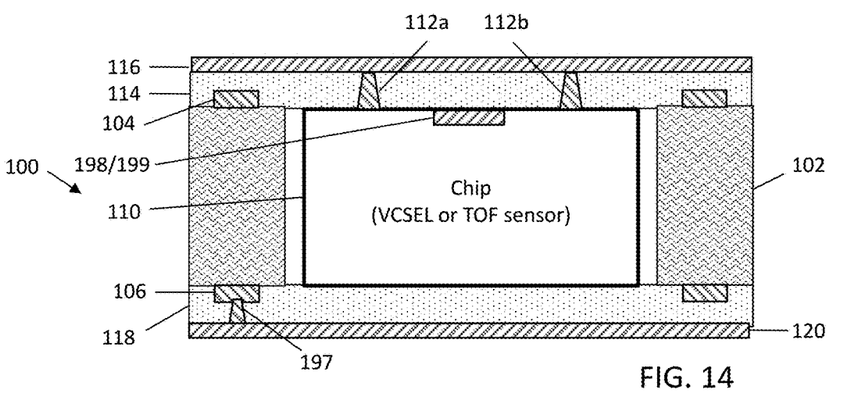
Figure 15:
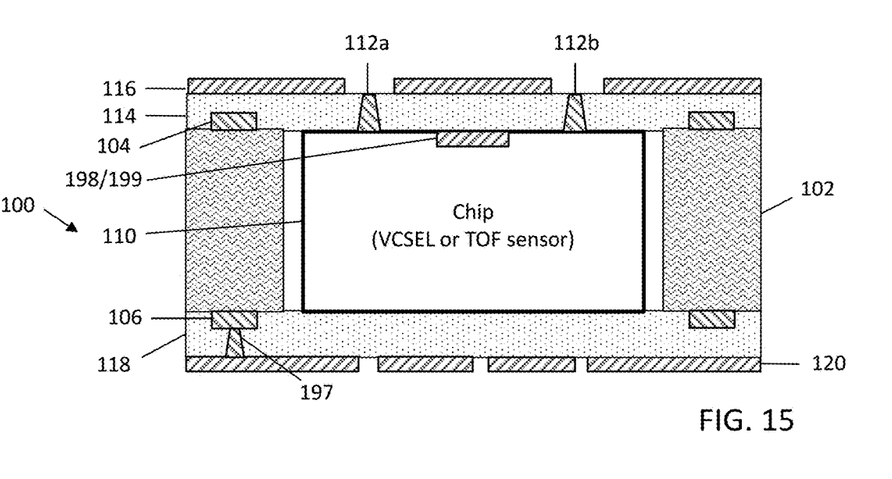

At least a portion of the adhesive layer 108 is then removed, and another sheet of optically transparent material 118 is placed adjacent the bottom surface of the chip 110, interconnect layer 106, and substrate 102, and pressed into place (FIG. 13, FIG. 14). The sheet of optically transparent material 118 has pre-formed copper cladding 120 therein.

Figure 16:
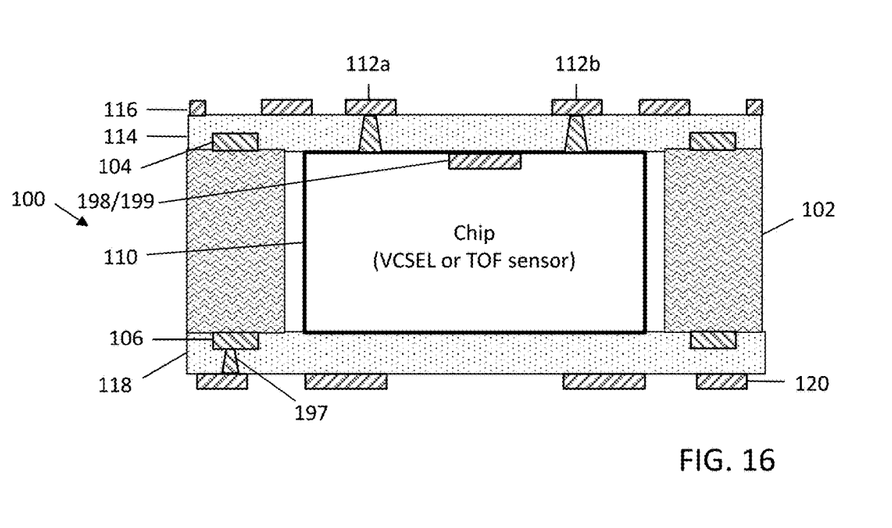
Figure 17:
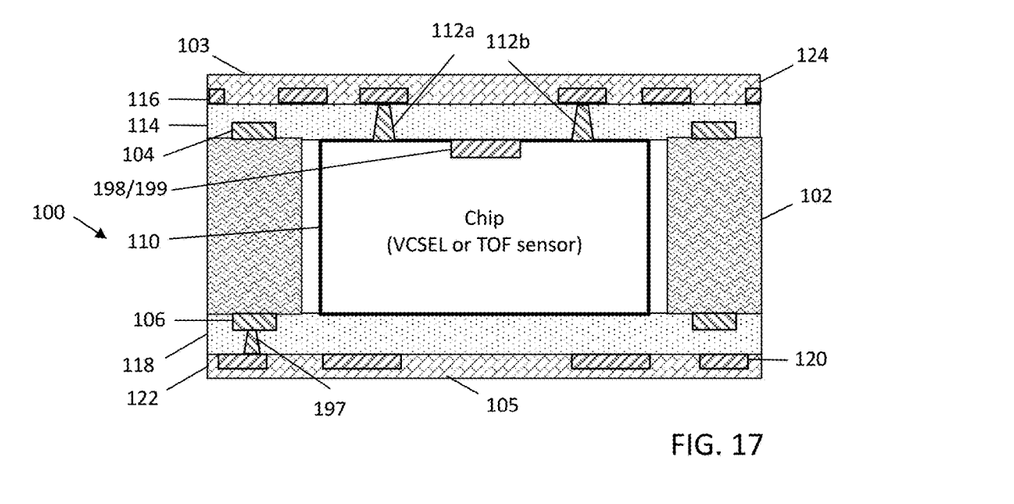

Thereafter, the copper layers 116 and 120 are etched (FIG. 15), and etching is performed so as to pattern them into the desired interconnect layers (FIG. 16). At this point, if desired, portions of the optically transparent material 114 adjacent the top surface of the chip 110 may be removed.

Then, photo resist layers 103 and 105 are respectively patterned over the outer surfaces of the optically transparent layers 114 and 118 (FIG. 17), and then the protective layers 128 and 126 are formed via plating (shown in FIG. 1).

The formation of the electronic device 100 using the techniques described above provide for a high yield and low cost of manufacture. These techniques allow for the formation of an electronic device 100 in which the die size is up to 40% the size of the substrate.

Many modifications and other embodiments will come to the mind of one skilled in the art having the benefit of the teachings presented in the foregoing descriptions and the associated drawings. Therefore, it is understood that various modifications and embodiments are intended to be included within the scope of the appended claims.

The invention claimed is:

1. An electronic device, comprising:
a substrate;
an integrated circuit disposed within the substrate and having a top surface, wherein the integrated circuit comprises one of a laser emitting integrated circuit and a reflected light detector;
a first wiring layer formed on the top surface of the substrate;
a first optically transparent layer formed on the top surface of the substrate and covering the top surface of the integrated circuit, wherein the first optically transparent layer has an aperture formed therein exposing at least a portion of the top surface of the integrated circuit; and
a second wiring layer formed on a top surface of the first optically transparent layer;
wherein the second wiring layer is patterned so as to not obstruct light traveling to or from the top surface of the integrated circuit through the first optically transparent layer.

2. The electronic device of claim 1, further comprising a transparent cap disposed over a top surface of the second wiring layer and the first optically transparent layer.

3. The electronic device of claim 2, wherein the transparent cap comprises a lens.

4. The electronic device of claim 1, further comprising a transparent cap disposed over a top surface of the integrated circuit and having a top surface covered by the first optically transparent layer.

5. The electronic device of claim 1, wherein the integrated circuit comprises a laser emitting integrated circuit configured to emit laser light from the top surface thereof, with the emitted laser light having a given wavelength; and wherein the first optically transparent layer is optically transparent to light having the given wavelength.

6. The electronic device of claim 1, further comprising:
a third wiring layer formed on a bottom surface of the substrate;
a second optically transparent layer formed on the bottom surface of the substrate;
a fourth wiring layer formed on the second optically transparent layer.

7. The electronic device of claim 6, wherein the laser emitting integrated circuit includes a diode having an anode terminal coupled to one of the second and fourth wiring layers and a cathode terminal coupled to the other of the second and the fourth wiring layers.

8. The electronic device of claim 1, further comprising a metallic coating layer disposed on portions of the second wiring layer.

9. The electronic device of claim 8, wherein the metallic coating layer comprises nickel-gold.

10. The electronic device of claim 1, wherein the laser emitting integrated circuit comprises a vertical cavity surface emitting laser (VCSEL) integrated circuit.

11. The electronic device of claim 10, wherein the VCSEL integrated circuit includes a VCSEL diode having an anode and a cathode that are each coupled to the second wiring layer.

12. An electronic device, comprising:
a substrate;
an integrated circuit disposed within the substrate and having a top surface, wherein the integrated circuit comprises one of a laser emitting integrated circuit and a reflected light detector;
a first wiring layer formed on the top surface of the substrate;
a first optically transparent layer formed on the top surface of the substrate and covering the top surface of the integrated circuit, wherein the first optically transparent layer has a reduced thickness portion adjacent a top surface of the integrated circuit; and
a second wiring layer formed on a top surface of the first optically transparent layer;
wherein the second wiring layer is patterned so as to not obstruct light traveling to or from the top surface of the integrated circuit through the first optically transparent layer.

13. An electronic device, comprising:
a substrate;
a laser emitting integrated circuit disposed within the substrate and having a top surface;
a first wiring layer formed on a top surface of the substrate;
a first optically transparent layer formed on the top surface of the substrate and covering the top surface of the laser emitting integrated circuit, wherein the first optically transparent layer has an aperture formed therein exposing at least a portion of the top surface of the laser emitting integrated circuit;
a second wiring layer formed on a top surface of the first optically transparent layer;
wherein the second wiring layer is patterned so as to permit light emitted from the top surface of the laser emitting integrated circuit to pass through the first optically transparent layer and exit the electronic device.

14. The electronic device of claim 13, further comprising a transparent cap disposed over a top surface of the second wiring layer and the first optically transparent layer.

15. The electronic device of claim 13, further comprising a transparent cap disposed over a top surface of the laser emitting integrated circuit and having a top surface covered by the first optically transparent layer.

16. The electronic device of claim 13, wherein the light emitting integrated circuit comprises a diode having an anode and a cathode that are each coupled to the second wiring layer.

17. The electronic device of claim 13, wherein the laser emitting integrated circuit includes a VCSEL diode having an anode and a cathode that are each coupled to the second wiring layer.

18. An electronic device, comprising:
a substrate;
a reflected light detector disposed within the substrate and having a top surface;
a first interconnect layer formed on the top surface of the substrate;
a first optically transparent layer formed on a top surface of the substrate and covering the top surface of the reflected light detector, wherein the first optically transparent layer has an aperture formed therein exposing at least a portion of the top surface of the reflected light detector;
a second interconnect layer formed on a top surface of the first optically transparent layer;
wherein the second interconnect layer is patterned so as to permit light to pass through the first optically transparent layer and reach the reflected light detector.

19. The electronic device of claim 18, further comprising a transparent cap disposed over a top surface of the second interconnect layer and the first optically transparent layer.

20. The electronic device of claim 18, further comprising a transparent cap disposed over a top surface of the reflected light detector and having a top surface covered by the first optically transparent layer.

21. The electronic device of claim 12, further comprising a transparent cap disposed over a top surface of the second wiring layer and the first optically transparent layer.

22. The electronic device of claim 21, wherein the transparent cap comprises a lens.

23. The electronic device of claim 12, further comprising a transparent cap disposed over a top surface of the integrated circuit and having a top surface covered by the first optically transparent layer.

24. The electronic device of claim 12, wherein the integrated circuit comprises a laser emitting integrated circuit configured to emit laser light from the top surface thereof, with the emitted laser light having a given wavelength; and wherein the first optically transparent layer is optically transparent to light having the given wavelength.

* * * * *